(12) United States Patent
Sarpatwari et al.

(10) Patent No.: US 11,664,074 B2
(45) Date of Patent: May 30, 2023

(54) PROGRAMMING INTERMEDIATE STATE TO STORE DATA IN SELF-SELECTING MEMORY CELLS

(71) Applicant: Micron Technology, Inc., Boise, ID (US)

(72) Inventors: Karthik Sarpatwari, Boise, ID (US); Nevil N. Gajera, Meridian, ID (US); Lingming Yang, Meridian, ID (US); Yen Chun Lee, Boise, ID (US); Jessica Chen, Boise, ID (US); Francesco Douglas Verna-Ketel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 17/336,913

(22) Filed: Jun. 2, 2021

(65) Prior Publication Data

US 2022/0392535 A1 Dec. 8, 2022

(51) Int. Cl.
*G11C 11/00* (2006.01)
*G11C 16/10* (2006.01)
*G11C 16/08* (2006.01)
*G11C 16/24* (2006.01)
*G11C 16/04* (2006.01)

(52) U.S. Cl.
CPC .............. *G11C 16/10* (2013.01); *G11C 16/08* (2013.01); *G11C 16/24* (2013.01); *G11C 16/0483* (2013.01)

(58) Field of Classification Search
CPC ......... G11C 16/10; G11C 16/08; G11C 16/24; G11C 16/0483
See application file for complete search history.

(56) References Cited

U.S. PATENT DOCUMENTS

| 6,084,795 A | 7/2000 | Nunokawa |
| 6,091,621 A | 7/2000 | Wang et al. |
| 7,864,567 B2 | 1/2011 | Gordon et al. |

(Continued)

OTHER PUBLICATIONS

Title: Multi-Step Pre-Read for Write Operations in Memory Devices, U.S. Appl. No. 17/154,644, filed Jan. 21, 2021, Inventors: Yen Chun Lee et al., Status: Publications—Issue Fee Payment Verified, May 18, 2022.

(Continued)

*Primary Examiner* — Pho M Luu
(74) *Attorney, Agent, or Firm* — Greenberg Traurig

(57) ABSTRACT

Systems, methods and apparatus to program memory cells to an intermediate state. A first voltage pulse is applied in a first polarity across each respective memory cell among the memory cells to move its threshold voltage in the first polarity to a first voltage region representative of a first value. A second voltage pulse is then applied in a second polarity to further move its threshold voltage in the first polarity to a second voltage region representative of a second value and the intermediate state. A magnitude of the second voltage pulse applied for the memory cells is controlled by increasing the magnitude in increments until the memory cells are sensed to be conductive. Optionally, prior to the first voltage pulse, a third voltage pulse is applied in the second polarity to cancel or reduce a drift in threshold voltages of the respective memory cell.

18 Claims, 6 Drawing Sheets

FIG. 2

(56) References Cited

U.S. PATENT DOCUMENTS

| | | | |
|---|---|---|---|
| 8,406,058 B2 * | 3/2013 | Wu | G11C 8/08 365/189.11 |
| 9,099,174 B2 | 8/2015 | Calderoni et al. | |
| 9,275,730 B2 | 3/2016 | Tortorelli et al. | |
| 9,613,691 B2 | 4/2017 | Mantegazza et al. | |
| 10,431,301 B2 | 10/2019 | Mirichigni et al. | |
| 10,566,052 B2 | 2/2020 | Mirichigni et al. | |
| 10,755,781 B2 | 8/2020 | Robustelli | |
| 10,950,315 B1 | 3/2021 | Jeon et al. | |
| 11,024,347 B2 * | 6/2021 | Bringivijayaraghavan | G11C 7/12 |
| 11,139,034 B1 | 10/2021 | Sarpatwari et al. | |
| 11,238,945 B1 | 2/2022 | Di Vincenzo | |
| 11,295,822 B2 | 4/2022 | Sarpatwari et al. | |
| 11,367,484 B1 | 6/2022 | Lee et al. | |
| 11,404,130 B1 * | 8/2022 | Gajera | G11C 16/30 |
| 2005/0226034 A1 | 10/2005 | Pemer | |
| 2007/0237016 A1 | 10/2007 | Miyamoto et al. | |
| 2009/0027961 A1 | 1/2009 | Park et al. | |
| 2009/0207645 A1 | 8/2009 | Parkinson | |
| 2011/0019495 A1 | 1/2011 | Scheuerlein et al. | |
| 2011/0182109 A1 | 7/2011 | Ikeda et al. | |
| 2016/0125952 A1 | 5/2016 | Hu et al. | |
| 2017/0125097 A1 | 5/2017 | Tortorelli et al. | |
| 2017/0309341 A1 | 10/2017 | Eldredge et al. | |
| 2018/0040370 A1 | 2/2018 | Tortorelli et al. | |
| 2019/0341112 A1 | 11/2019 | Castro | |
| 2020/0066343 A1 | 2/2020 | Castro et al. | |
| 2021/0011769 A1 | 1/2021 | Xie et al. | |
| 2021/0125656 A1 | 4/2021 | Muller | |
| 2021/0201995 A1 | 7/2021 | Castro et al. | |
| 2021/0202018 A1 | 7/2021 | Hirst et al. | |
| 2021/0312976 A1 | 10/2021 | Pellizzer et al. | |
| 2021/0336132 A1 | 10/2021 | Lee et al. | |
| 2022/0013167 A1 | 1/2022 | Robustelli et al. | |
| 2022/0013183 A1 | 1/2022 | Sarpatwari et al. | |
| 2022/0068391 A1 | 3/2022 | Tortorelli et al. | |
| 2022/0284957 A1 | 9/2022 | Lee et al. | |

OTHER PUBLICATIONS

Title: Multi-Step Pre-Read for Write Operations in Memory Devices, U.S. Appl. No. 17/824,776, Inventors: Yen Chun Lee et al., Status: Application Undergoing Preexam Processing, May 25, 2022.

Title: Self-Selecting Memory Cells Configured to Store More Than One Bit per Memory Cell, U.S. Appl. No. 17/337,806, filed Jun. 3, 2021, Inventors: Lingming Yang et al., Status: Docketed New Case—Ready for Examination, dated Aug. 23, 2021.

Title: Multi-Step Pre-Read for Write Operations in Memory Devices, U.S. Appl. No. 17/154,644, filed Jan. 21, 2021, Inventors: Yen Chun Lee et al., Status: Application Dispatched from Preexam, Not Yet Docketed, Feb. 25, 2021.

Title: Self-Selecting Memory Cells Configured to Store More Than One Bit per Memory Cell, U.S. Appl. No. 17/337,806, filed Jun. 3, 2021, Inventors: Lingming Yang et al., Status: Application Undergoing Preexam Processing, Jun. 3, 2021.

International Search Report and Written Opinion, PCT/US2022/029497, dated Sep. 1, 2022.

International Search Report and Written Opinion, PCT/US2022/029498, dated Aug. 30, 2022.

* cited by examiner

US 11,664,074 B2

PROGRAMMING INTERMEDIATE STATE TO STORE DATA IN SELF-SELECTING MEMORY CELLS

TECHNICAL FIELD

At least some embodiments disclosed herein relate to memory systems in general and, more particularly but not limited to, techniques of configuring memory cells to store data.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

A memory device can include a memory integrated circuit having one or more arrays of memory cells formed on an integrated circuit die of semiconducting material. A memory cell is a smallest unit of memory that can be individually used or operated upon to store data. In general, a memory cell can store one or more bits of data.

Different types of memory cells have been developed for memory integrated circuits, such as random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), flash memory, etc.

Some integrated circuit memory cells are volatile and require power to maintain data stored in the cells. Examples of volatile memory include Dynamic Random-Access Memory (DRAM) and Static Random-Access Memory (SRAM).

Some integrated circuit memory cells are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Flash memory includes negative-and (NAND) type flash memory or a negative-or (NOR) type flash memory. A NAND memory cell is based on a NAND logic gate; and a NOR memory cell is based on a NOR logic gate.

Cross-point memory (e.g., 3D XPoint memory) uses an array of non-volatile memory cells. The memory cells in cross-point memory are transistor-less. Each of such memory cells can have a selector device and optionally a phase-change memory device that are stacked together as a column in an integrated circuit. Memory cells of such columns are connected in the integrated circuit via two layers of wires running in directions that are perpendicular to each other. One of the two layers is above the memory cells; and the other layer is below the memory cells. Thus, each memory cell can be individually selected at a cross point of two wires running in different directions in two layers. Cross point memory devices are fast and non-volatile and can be used as a unified memory pool for processing and storage.

A non-volatile integrated circuit memory cell can be programmed to store data by applying a voltage or a pattern of voltage to the memory cell during a program/write operation. The program/write operation sets the memory cell in a state that corresponds to the data being programmed/stored into the memory cell. The data stored in the memory cell can be retrieved in a read operation by examining the state of the memory cell. The read operation determines the state of the memory cell by applying a voltage and determining whether the memory cell becomes conductive at a voltage corresponding to a pre-defined state.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
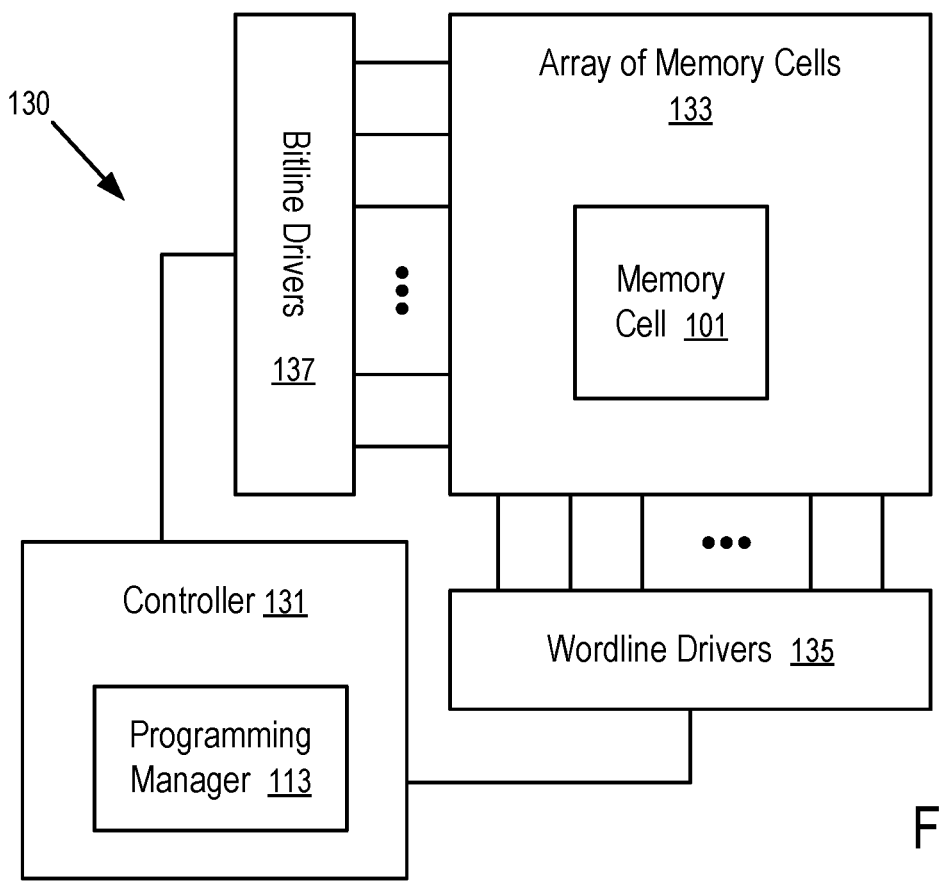
FIG. 1 shows a memory device configured with a programming manager according to one embodiment.

At least some aspects of the present disclosure are directed to a memory sub-system configured to program the threshold voltage of a self-selecting memory cell to an intermediate state between two states that are relatively easy to program. Before applying an initial write pulse, an optional voltage pulse can be applied on the memory cell to place the memory cell in a conductive state to cancel or reduce a possible drift away from the state that has been previously programmed for the memory cell. The initial write pulse is applied in a polarity, opposite to the polarity of the optional drift-canceling voltage pulse, to place the memory cell in one of the two states. Then, a subsequent voltage pulse is applied on the memory cell in a polarity, opposite to the polarity of the initial write pulse, to move the memory cell to the intermediate state. The magnitude of the subsequent voltage pulse can be controlled based on a count of memory cells, among a group of memory cells addressed to store a date item (e.g., a codeword of an Error Correction Code (ECC)), where the counted memory cells become conductive under the applied magnitude of the subsequent voltage pulse. The group of memory cells addressed to store the date item has a known number of memory cells to be programmed to the intermediate state; and the magnitude can be increased in increments until the count of the conductive memory cells matches with the known number.

The memory sub-system can be used as a storage device and/or a memory module. Examples of storage devices, memory modules, and memory devices are described below in conjunction with FIG. 10. A host system can utilize a memory sub-system that includes one or more components, such as memory devices that store data. The host system can provide data to be stored at the memory sub-system and can request data to be retrieved from the memory sub-system.

An integrated circuit memory cell, such as a memory cell in a flash memory or a memory cell in a cross-point memory, can be programmed to store data by the way of its state at a voltage applied across the memory cell.

For example, if a memory cell is configured or programmed in such a state that allows a substantial current to pass the memory cell at a voltage in a predefined voltage region, the memory cell is considered to have been configured or programmed to store a first bit value (e.g., one or zero); and otherwise, the memory cell is storing a second bit value (e.g., zero or one).

Optionally, a memory cell can be configured or programmed to store more than one bit of data by being configured or programmed to have a threshold voltage in one of more than two separate voltage regions.

The threshold voltage of a memory cell is such that when the magnitude of the voltage applied across the memory cell is increased to above the threshold voltage, the memory cell changes rapidly or abruptly, snaps, or jumps from a non-conductive state to a conductive state. The non-conductive state allows a small leak current to go through the memory cell; and in contrast, the conductive state allows more than a threshold amount of current to go through. Thus, a memory device can use a sensor to detect the change, or determine the conductive/non-conductive state of the memory device at one or more applied voltages, to evaluate or classify the level of the threshold voltage of the memory cell and thus its stored data.

The threshold voltage of a memory cell being configured or programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in Quad-Level Cell (QLC) mode, or a five-bit data item in a Penta-Level Cell (PLC) mode.

The threshold voltage of a memory cell can change or drift over a period of time, usage, and/or read operations, and in response to certain environmental factors, such as temperate changes. The rate of change or drift can increase as the memory cell ages. The change or drift can result in errors in determining, retrieving, or reading the data item back from the memory cell.

Random errors in reading memory cells can be detected and corrected using redundant information. Data to be stored into memory cells can be encoded to include redundant information to facilitate error detection and recovery. When data encoded with redundant information is stored in a memory sub-system, the memory sub-system can detect errors in data represented by the voltage regions of the threshold voltages of the memory cells and/or recover the original data that is used to generate the data used to program the threshold voltages of the memory cells. The recovery operation can be successful (or have a high probability of success) when the data represented by the threshold voltages of the memory cells and thus retrieved directly from the memory cells in the memory sub-system contains fewer errors, or the bit error rate in the retrieved data is low and/or when the amount of redundant information is high. For example, error detection and data recovery can be performed using techniques such as Error Correction Code (ECC), Low-Density Parity-Check (LDPC) code, etc.

It is a challenge to efficiently program a memory cell into an intermediate state representing by its threshold voltage being in a voltage region assigned to represent a value, separate from a high voltage region and a low voltage region. It is relatively easy to program the threshold voltage of a memory cell into the high voltage region and the low voltage region. It is difficult to precisely program the threshold voltage of the memory cell into an intermediate region between, but having no overlapping with, the high voltage region and the low voltage region.

At least some aspects of the present disclosure address the above and other deficiencies and/or challenges by controlling the magnitude of a programming pulse based on a count of memory cells that become conductive under the applied magnitude. For example, the programming pulse is applied in the opposite polarity of an initial programming pulse that is configured to reliably move the threshold voltage of a memory cell into an initial region. The initial voltage region is determined primarily by the polarity of the initial voltage pulse and the current passing through the memory cell while the memory cell is conductive during the initial voltage pulse. To move the threshold voltage of the memory cell into an alternative region, separate from the initial region, the subsequent programming pulse is applied in a polarity that is opposite to the polarity of the initial programming pulse. To move the threshold voltage to the alternative region, the magnitude of the subsequent programming pulse is configured to place the memory cell into a conductive state. To best position the alternative region and to facilitate accurate results in reading, the magnitude of the subsequent programming pulse can be dynamically configured for the set of memory cells being programmed to the alternative region, by increasing the magnitude in increments until memory cells in the set are determined to be in a conductive state at the applied magnitude.

Before the initial programming pulse is applied, an optional voltage pulse can be applied to the memory cell in the opposite polarity of the initial programming pulse such that if the threshold voltage of the memory cell is not already in the initial region, the optional voltage pulse can place the memory cell in a conductive state to cancel or reduce a possible drift from the previously programmed threshold voltage.

FIG. 1 shows a memory device 130 configured with a programming manager 113 according to one embodiment.

In FIG. 1, the memory device 130 includes an array 133 of memory cells, such as a memory cell 101. An array 133 can be referred to as a tile; and a memory device (e.g., 130) can have one or more tiles. Different tiles can be operated in parallel in a memory device (e.g., 130).

For example, the memory device 130 illustrated in FIG. 1 can have a cross-point memory having at least the array 133 of memory cells (e.g., 101).

In some implementations, the cross point memory uses a memory cell 101 that has an element (e.g., a sole element) acting both as a selector device and a memory device. For example, the memory cell 101 can use a single piece of alloy with variable threshold capability. The read/write operations of such a memory cell 101 can be based on thresholding the memory cell 101 while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

The memory device 130 of FIG. 1 includes a controller 131 that operates bitline drivers 137 and wordline drivers 135 to access the individual memory cells (e.g., 101) in the array 133.

Figure 2:
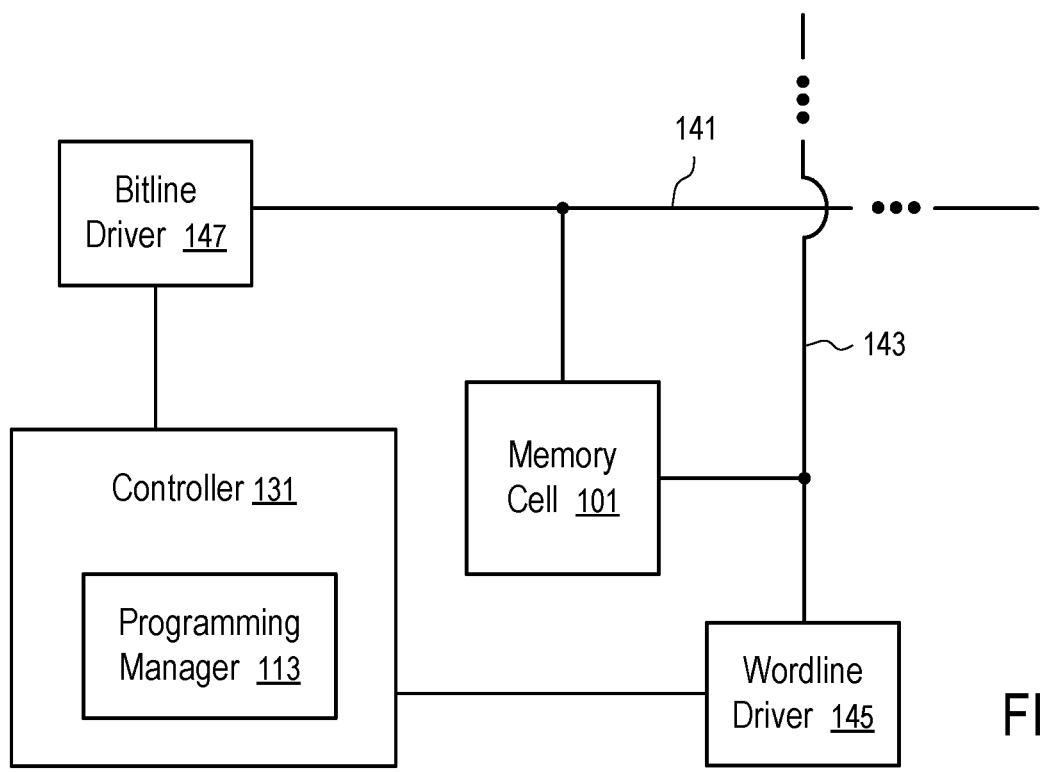
FIG. 2 shows a memory cell with a bitline driver and a wordline driver configured to apply voltage pulses according to one embodiment.

For example, each memory cell (e.g., 101) in the array 133 can be accessed via voltages driven by a pair of a bitline driver 147 and a wordline driver 145, as illustrated in FIG. 2.

The controller 131 includes a programming manager 113 configured to implement a counter-controlled programming pulse. The programming manager 113 can be implemented, for example, via logic circuits and/or microcodes/instructions. For example, to program the threshold voltage of the memory cell 101 into a second voltage region adjacent to a first voltage region, the programming manager 113 can instruct the bitline drivers 137 and the wordline drivers 135 to initially apply a voltage pulse configured to program the threshold voltage of the memory cell 101 into the first voltage region. After the completion of the initial voltage pulse, the programming manager 113 further instructs the bitline drivers 137 and the wordline drivers 135 to apply a subsequent voltage pulse to move the threshold voltage of the memory cell 101 from the first voltage region to the adjacent second voltage region that is separate from the first voltage region. The magnitude of the subsequent voltage pulse is dynamically controlled for a set of memory cells that are to be read together for a data item (e.g., a codeword for error detection and data recovery using an Error Correction Code (ECC)). The programming manager 113 can instruct the bitline drivers 137 and the wordline drivers 135 to increase the applied magnitude in increments until each and every of the memory cells to be programmed to the second voltage regions are conductive under the applied magnitude. For example, a counter can be used to count the number of memory cells that are in a conductive state under the current increment of the magnitude. When the magnitude is increased to a level of increment that causes the value in the counter to be equal to the number of memory cells in the codeword to be programmed to the adjacent second voltage region, no further increment is applied to the magnitude of the subsequent voltage pulse applied to the memory cells.

FIG. 2 shows a memory cell 101 with a bitline driver 147 and a wordline driver 145 configured to apply voltage pulses according to one embodiment. For example, the memory cell 101 can be a typical memory cell 101 in the memory cell array 133 of FIG.

The bitline driver 147 and the wordline driver 145 of FIG. 2 are controlled by the programming manager 113 of the controller 131 to selectively apply one or more voltages pulses to the memory cell 101.

The bitline driver 147 and the wordline driver 145 can apply voltages of different polarities on the memory cell 101.

For example, in applying one polarity of voltage (e.g., positive polarity), the bitline driver 147 drives a positive voltage relative to the ground on a bitline 141 connected to a row of memory cells in the array 133; and the wordline driver 145 drives a negative voltage relative to the ground on a wordline 143 connected to a column of memory cells in the array 133.

In applying the opposite polarity of voltage (e.g., negative polarity), the bitline driver 147 drives a negative voltage on the bitline 141; and the wordline driver 145 drives a positive voltage on the wordline 143.

The memory cell 101 is in both the row connected to the bitline 141 and the column connected to the wordline 143. Thus, the memory cell 101 is subjected to the voltage difference between the voltage driven by the bitline driver 147 on the bitline 141 and the voltage driven by the wordline driver 145 on the wordline 143.

In general, when the voltage driven by the bitline driver 147 is higher than the voltage driven by the wordline driver 145, the memory cell 101 is subjected to a voltage in one polarity (e.g., positive polarity); and when the voltage driven by the bitline driver 147 is lower than the voltage driven by the wordline driver 145, the memory cell 101 is subjected to a voltage in the opposite polarity (e.g., negative polarity).

In some implementations, the memory cell 101 is a self-selecting memory cell implemented using a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (Cl), or fluorine (F), each in atomic or molecular forms. The selector/memory device has a top side and a bottom side. A top electrode is formed on the top side of the selector/memory device for connecting to a bitline 141; and a bottom electrode is formed on the bottom side of the selector/memory device for connecting to a wordline 143. For example, the top and bottom electrodes can be formed of a carbon material. For example, a chalcogenide material of the memory cell 101 can take the form of a crystalline atomic configuration or an amorphous atomic configuration. The threshold voltage of the memory cell 101 can be dependent on the ratio of the material in the crystalline configuration and the material of the amorphous configuration in the memory cell 101. The ratio can change under various conditions (e.g., having currents of different magnitudes and directions going through the memory cell 101).

A self-selecting memory cell 101, having a selector/memory device, can be programmed to have a threshold voltage window. The threshold voltage window can be created by applying programming pulses with opposite polarity to the selector/memory device. For example, the memory cell 101 can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity. When programmed, the memory cell has a low threshold (e.g., lower than the cell that has been reset, or a cell that has been programmed to have a high threshold), such that during a read operation, the read voltage can cause a programmed cell to snap and thus become conductive while a reset cell remains non-conductive.

For example, to program the voltage threshold of the memory cell 101, the bitline driver 147 and the wordline driver 145 can drive a pulse of voltage onto the memory cell 101 in one polarity (e.g., positive polarity) to snap the memory cell 101 such that the memory cell 101 is in a conductive state. While the memory cell 101 is conductive, the bitline driver 147 and the wordline driver 145 continue driving the programming pulse to change the threshold voltage of the memory cell 101 towards a voltage region that represents the data or bit value(s) to be stored in the memory cell 101.

The controller 131 can be configured in an integrated circuit having a plurality of decks of memory cells. Each deck can be sandwiched between a layer of bitlines, a layer of wordlines; and the memory cells in the deck can be arranged in an array 133. A deck can have one or more arrays or tiles. Adjacent decks of memory cells may share a layer of bitlines (e.g., 141) or a layer of wordlines (e.g., 143). Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers 137 are connected to bitlines in the decks; and wordline drivers 135 are connected to wordlines in the decks. Thus, a typical memory cell 101 is connected to a bitline driver 147 and a wordline driver 145.

The threshold voltage of a typically memory cell 101 is configured to be sufficiently high such that when only one of its bitline driver 147 and wordline driver 145 drives a voltage in either polarity while the other voltage driver holds the respective line to the ground, the magnitude of the voltage applied across the memory cell 101 is insufficient to cause the memory cell 101 to become conductive. Thus, addressing the memory cell 101 can be performed via both of its bitline driver 147 and wordline driver 145 driving a voltage in opposite polarity relative to the ground for operating/selecting the memory cell 101. Other memory cells connected to the same wordline driver 145 can be de-selected by their respective bitline drivers holding the respective bitlines to the ground; and other memory cells connected to the same bitline driver can be de-selected by their respective wordline drives holding the respective wordlines to the ground.

A group of memory cells (e.g., 101) connected to a common wordline driver 145 can be selected for parallel operation by their respective bitline drivers (e.g., 147) driving up the magnitude of voltages in one polarity while the wordline driver 145 is also driving up the magnitude of a voltage in the opposite polarity. Similarly, a group of memory cells connected to a common bitline driver 147 can be selected for parallel operation by their respective wordline drivers (e.g., 145) driving voltages in one polarity while the bitline driver 147 is also driving a voltage in the opposite polarity.

At least some examples are disclosed herein in reference to a cross-point memory having self-selecting memory cells. Other types of memory cells and/or memory having similar threshold voltage characteristics can also be used. For example, memory cells each having a selector device and a phase-change memory device and/or flash memory cells can also be used in at least some embodiments.

Figure 3:
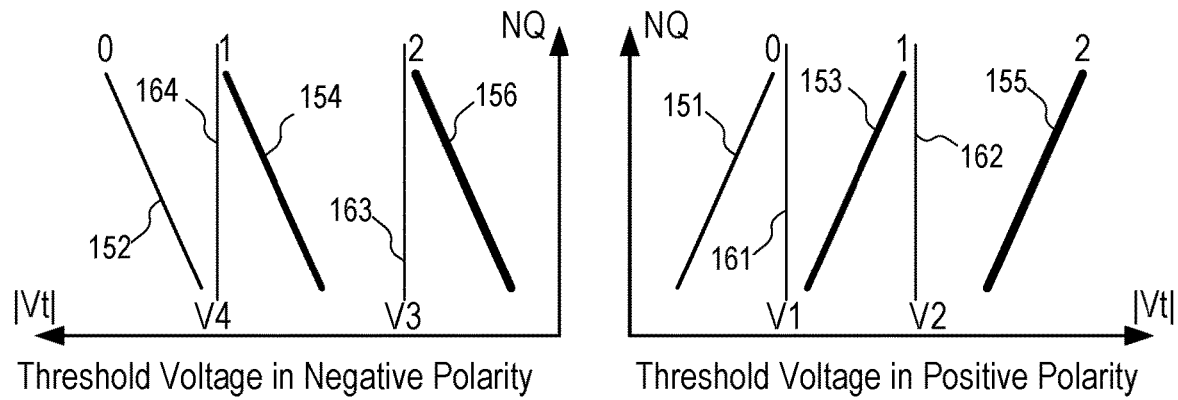
FIG. 3 illustrates distributions of threshold voltages of memory cells each configured to represent one of three predetermined values according to one embodiment.

FIG. 3 illustrates distributions of threshold voltages of memory cells each configured to represent one of three predetermined values according to one embodiment. For example, the programming manager 113 of FIGS. 1 and 2 can be used to program the threshold voltage of a memory cell 101 such that the probability distribution of its threshold voltage is as illustrated in FIG. 3.

The probability distribution of the threshold voltage of a memory cell can be illustrated via a normal quantile (NQ) plot, as in FIG. 3. When a probability distribution (e.g., 151) of threshold voltage programmed in a region is a normal distribution (also known as Gaussian distribution), its normal quantile (NQ) plot is seen as aligned on a straight line (e.g., distribution 151).

A self-selecting memory cell (e.g., 101) can have a threshold voltage in negative polarity and a threshold voltage in positive polarity. When a voltage applied on the memory cell 101 in either polarity is increased in magnitude up to its threshold voltage in the corresponding polarity, the memory cell (e.g., 101) snaps from a non-conductive state to a conductive state.

The threshold voltage of a memory cell 101 in negative polarity and the threshold voltage of the memory cell 101 in positive polarity can have different magnitudes. Memory cells programmed to have large magnitudes in threshold voltages in positive polarity can have small magnitudes in threshold voltages in negative polarity; and memory cells programmed to have small magnitudes in threshold voltages in positive polarity can have large magnitudes in threshold voltages in negative polarity.

Figure 4:
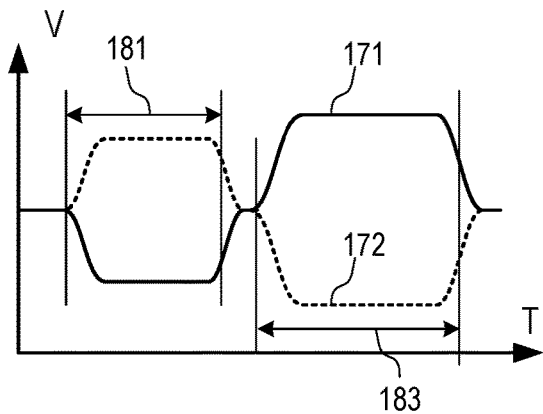
FIGS. 4 to 7 illustrate voltage pulses applied to configure memory cells to store data according to some embodiments.

For example, a memory cell 101 can be programmed to have a small magnitude in threshold voltage according to distribution 151 in the positive polarity to represent a value (e.g., zero); and as a result, its threshold voltage has a large magnitude according to distribution 152 in the negative polarity to represent the same value (e.g., zero). The threshold voltages of the memory cell 101 in the positive and negative polarities can be programmed to the distributions 151 and 152 by applying a voltage pulse in the positive polarity (e.g., as illustrated in FIG. 4) to place the memory cell 101 in a conductive state and to cause a predetermined level of current (e.g., 120 µA) to go through the memory cell 101.

Figure 5:
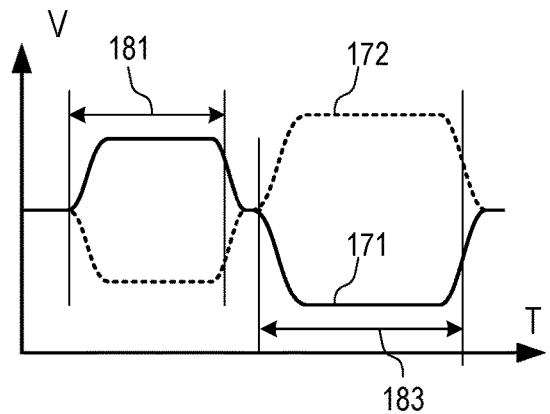

Alternatively, the memory cell 101 can be programmed to have a smaller magnitude in threshold voltage according to distribution 156 in the negative polarity to represent another value (e.g., two); and as a result, its threshold voltage has a large magnitude according to distribution 155 in the positive polarity to represent the same value (e.g., two). The threshold voltages of the memory cell 101 in the positive and negative polarities can be programmed to the distributions 155 and 156 by applying a voltage pulse in the negative polarity (e.g., as illustrated in FIG. 5) to place the memory cell 101 in a conductive state and to cause a predetermined level of current (e.g., 120 µA) to go through the memory cell 101.

The state of having threshold voltages in the distributions 151 and 152 and the state of having threshold voltages in the distributions 155 and 156 are relatively easy to obtain. The programming of the memory cell 101 to such two states can be implemented using voltage pulses illustrated in FIGS. 4 and 5. The voltage regions of the distributions 151, 152, 155 and 156 are controlled primarily by the polarity of the programming voltage pulses and the level of current passing through the memory cell 101 near the end of the programming voltage pulses.

To facilitate the storing of more than one bit of data per memory cell, the memory cell 101 can be programmed into an intermediate state between the two states.

For example, the memory cell 101 can be programmed to have a medium magnitude in threshold voltage according to distribution 153 in the positive polarity to represent a further value (e.g., one); and as a result, its threshold voltage has a magnitude according to distribution 154 in the negative polarity to represent the same value (e.g., one). The threshold voltages of the memory cell 101 in the positive and negative polarities can be programmed to the distributions 153 and 154 by applying a voltage pulse to move the threshold voltages of the memory from the distributions 151 and 152, or from the distributions 155 and 156, as further discussed below in connection with FIGS. 6 and 7.

In some implementations, more than one intermediate state can be programmed in a similar way such that the threshold voltage in the positive polarity is in the voltage region of one of four distributions and the threshold voltage in the negative polarity is in the voltage region of one of four distributions. Such four states can be used to represent a two-bit data item stored in the memory cell 101.

In FIG. 3, the voltage distributions 151, 153 and 155 in the positive polarity are separated by read voltage V1 161 and read voltage V2 162. Thus, whether the threshold voltage of the memory cell 101 in the positive polarity is in the distribution 151 can be determined by testing whether the memory cell 101 is conductive at the read voltage V1 161 in the positive polarity; and whether the threshold voltage of the memory cell 101 in the positive polarity is in the distribution 155 can be determined by testing whether the memory cell 101 is non-conductive at the read voltage V2 162 in the positive polarity. If the threshold voltage of the memory cell 101 in the positive polarity is in neither the distribution 151 nor the distribution 155, it is in the distribution 153 representative of the corresponding value (e.g., one).

Similarly, in FIG. 3, the distributions 152, 154 and 156 in the negative polarity are separated by the read voltage V3 163 and read voltage V4 164. Thus, whether the threshold voltage of the memory cell 101 in the negative polarity is in the distribution 156 can be determined by testing whether the memory cell 101 is conductive at the read voltage V3 163 in the negative polarity; and whether the threshold voltage of the memory cell 101 in the negative polarity is in the distribution 152 can be determined by testing whether the memory cell 101 is non-conductive at the read voltage V4 164 in the negative polarity. If the threshold voltage of the memory cell 101 in the negative polarity is in neither the distribution 152 nor the distribution 156, it is in the distribution 154 representative of the corresponding value (e.g., one).

Thus, the determination of the state and thus the value represented by the state (e.g., region of threshold voltage) can be performed by reading the memory cell 101 in the positive polarity using the read voltages V1 and V2, or reading the memory cell 101 in the negative polarity using the read voltages V3 and V4, or a combination of reading the memory cell 101 in the negative polarity using read voltage V3 and in the positive polarity using read voltage V1.

FIGS. 4 to 7 illustrate voltage pulses applied to configure memory cells to store data according to some embodiments.

FIGS. 4 to 7 show, as a function of time T, a bitline voltage 172 driven by a bitline driver 147 on to a bitline 141 connected to a memory cell 101 and a wordline voltage 171 driven by a wordline driver 145 on to a wordline 143 connected to the memory cell 101.

When the bitline driver 147 and the wordline driver 145 drive a same voltage (e.g., ground) on the bitline 141 and the wordline 143 respectively, the voltage difference applied across the memory cell 101 is zero.

In FIG. 4, a programming pulse is configured in a time period 183. During the programming pulse, the wordline voltage 171 is higher than the bitline voltage 172. Thus, the voltage difference across the memory cell 101 is in one polarity (e.g., positive); and the magnitude of the voltage difference between the wordline voltage 171 and the bitline voltage 172 is configured to be sufficiently high (e.g., higher than the voltage region of distribution 155) to cause the memory cell 101 to snap into the conductive state. The voltage pulse during the time period 181 has a duration sufficient to bring the current passing through the memory cell 101 to reach a predetermined level (e.g., 120 µA). After the current reaches the predetermined level, the voltage difference across the memory cell 101 can be removed. As a result, the threshold voltage of the memory cell 101 in the positive polarity is in the distribution 151 illustrated in FIG. 3; and the threshold voltage of the memory cell 101 in the negative polarity is in the distribution 152 illustrated in FIG. 3. After the current reaches the predetermined level in the time period 181, the length of the duration in which the current is maintained at the level has no significant impact on the threshold voltages of the memory cell 101. The predetermined level of current is configured such that after the current reaches the predetermined level in the time period 181, the current does not change significantly as the application of the voltage difference across the memory cell 101 continues for a period of time.

Optionally, before the application of the programming pulse in the time period 183, an optional voltage pulse is applied in the time period 181 in FIG. 4. During the optional voltage pulse, the wordline voltage 171 is lower than the bitline voltage 172. Thus, the voltage difference across the memory cell 101 is in another polarity (e.g., negative); and the magnitude of the voltage difference between the wordline voltage 171 and the bitline voltage 172 is configured to be sufficiently high (e.g., higher than the voltage region of distributions 156 and/or 154) to cause the memory cell 101 to snap into the conductive state if the memory cell 101 is not already programmed into the distributions 151 and 152. After the memory cell 101 is conductive during the time period 181 in FIG. 4, more than a threshold level of current (e.g., 25 µA) can go through the memory cell 101. However, the current is maintained at the level (e.g., 25 µA) until the optional voltage pulse is removed. The application of the optional voltage pulse can have the effect of canceling or reducing a drift of the threshold voltage away from the distributions 153, 154, 155 and 156. Canceling or reducing the drift improves the result of the programming pulse applied in the time period 183 to move the threshold voltages of the memory cell 101 into the distributions 151 and 152 respective in the negative and positive polarities.

For example, in some instances, a drift can cause the threshold voltage of the memory cell 101 in the positive polarity to be higher than the predetermined magnitude of the programming pulse to be applied in the time period 183. In such a situation, without the optional voltage pulse in the time period 181, the programming pulse can fail to snap the memory cell 101 into the conductive state. By applying the optional voltage pulse in the time period 181, the memory cell 101 is placed in the conductive state in the opposite polarity of the programming pulse with a reduced current (e.g., 25 µA), the drift in the threshold voltages of the memory cell 101 can be canceled or reduced such that the threshold voltages of the memory cell 101 return to the previously programmed state (e.g., in distributions 155 and 156 or in distributions 153 and 154).

Canceling or reducing the drift can also reduce the variations in the threshold voltages of the memory cell 101 resulting from the application of the programming pulse in the time period 183 and thus reduce widths of the voltage regions of the distributions 151 and 152.

FIG. 5 is similar to FIG. 4 but with polarity reversal to program the memory cell to distributions 156 and 155.

In FIG. 5, a programming pulse is configured in a time period 183. During the programming pulse, the wordline voltage 171 is lower than the bitline voltage 172. Thus, the voltage difference across the memory cell 101 is in a polarity (e.g., negative) opposite to the polarity of the programming pulse in FIG. 4; and the magnitude of the voltage difference between the wordline voltage 171 and the bitline voltage 172 is configured to be sufficiently high (e.g., higher than the voltage region of distribution 152) to cause the memory cell 101 to snap into the conductive state. The voltage pulse during the time period 181 has a duration sufficient to bring the current passing through the memory cell 101 to reach a predetermined level (e.g., 120 µA). After the current reaches the predetermined level, the voltage difference across the memory cell 101 can be removed. As a result, the threshold voltage of the memory cell 101 in the negative polarity is in the distribution 156 illustrated in FIG. 3; and the threshold voltage of the memory cell 101 in the positive polarity is in the distribution 155 illustrated in FIG. 3. After the current reaches the predetermined level in the time period 181, the length of the duration in which the current is maintained at the level has no significant impact on the threshold voltages of the memory cell 101. The predetermined level of current is configured such that after the current reaches the predetermined level in the time period 181, the current does not change significantly as the application of the voltage difference across the memory cell 101 continues for a period of time.

Optionally, before the application of the programming pulse in the time period 183, an optional voltage pulse is applied in the time period 181 in FIG. 5. During the optional voltage pulse, the wordline voltage 171 is higher than the bitline voltage 172. Thus, the voltage difference across the memory cell 101 is in another polarity (e.g., positive), opposite to the polarity of the programming pulse in FIG. 5; and the magnitude of the voltage difference between the wordline voltage 171 and the bitline voltage 172 is configured to be sufficiently high (e.g., higher than the voltage region of distributions 151 and/or 153) to cause the memory cell 101 to snap into the conductive state if the memory cell 101 is not already programmed into the distributions 155 and 156. After the memory cell 101 is conductive during the time period 181 in FIG. 5, more than a threshold level of current (e.g., 25 µA) can go through the memory cell 101. However, the current is maintained at the level (e.g., 25 µA) until the optional voltage pulse is removed. The application of the optional voltage pulse can have the effect of canceling or reducing a drift of the threshold voltage away from the distributions 151, 152, 153 and 154. Canceling or reducing the drift improves the result of the programming pulse applied in the time period 183 to move the threshold voltages of the memory cell 101 into the distributions 151 and 152 respective in the negative and positive polarities.

Figure 6:
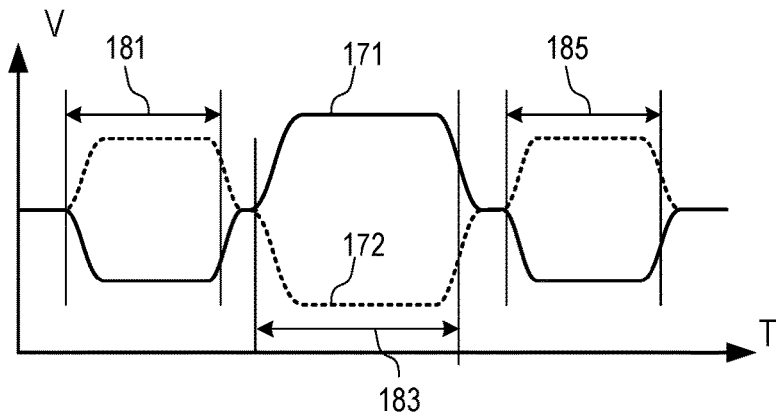

FIG. 6 can be used to program the threshold voltages of a memory cell 101 to an intermediate state corresponding to the distributions 153 and 154 illustrated in FIG. 3.

The voltage pulses in time period 181 and 183 can be the same or similar to that in corresponding time period 181 and 183 in FIG. 4. A subsequent voltage pulse is applied in the time period 185 to move the threshold voltages of the memory cell 101 from distributions 151 and 152 to distributions 153 and 154. The polarity of the voltage pulse in the time period 185 in FIG. 6 is the opposite of the polarity of the programming pulse applied in the time period 183 in FIG. 6 and in FIG. 4.

Figure 7:
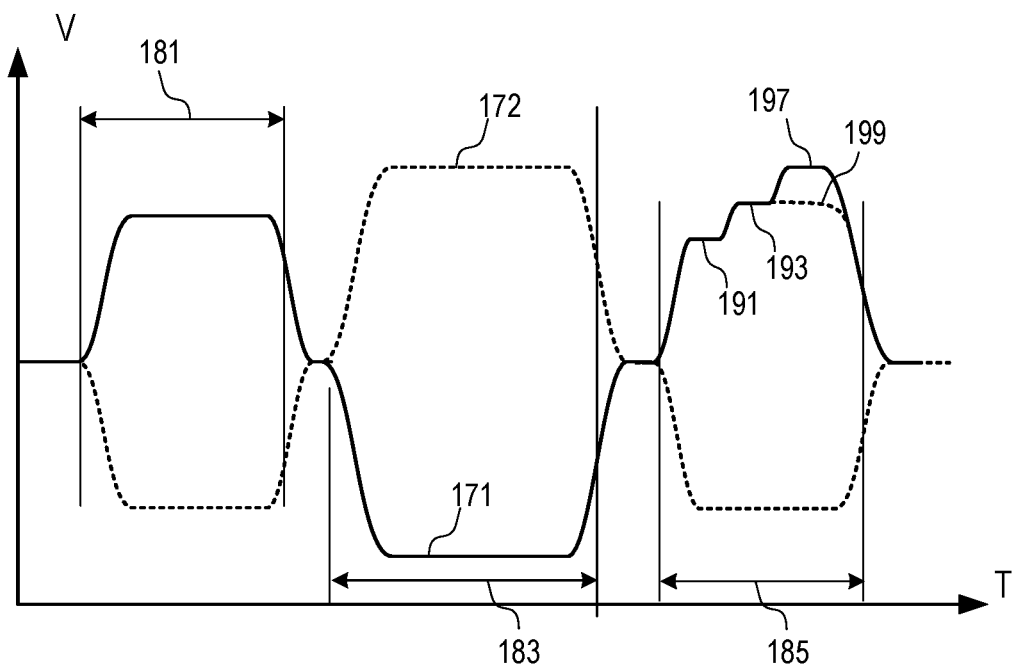

Alternatively, a subsequent voltage pulse can be added after the programming pulse applied in the time period 183 in FIG. 5 to move the threshold voltages of the memory cell 101 from the distributions 156 and 155 to the distributions 154 and 153, in a way similar to that illustrated in FIG. 7.

In FIG. 7, the voltage pulses applied in time period 181 and 183 can be the same or similar to that in the corresponding time period 181 and 183 in FIG. 5. After the programming pulse applied in time period 183, a subsequent voltage pulse is applied in FIG. 7 in time period 185 with a polarity that is opposite to the polarity of the programming pulse applied in the time period 183 in FIG. 7.

Further, in FIG. 7, the magnitude of the subsequent voltage pulse applied in the time period 185 can be controlled by a counter. For example, a group of memory cells can be programmed to store a codeword configured to enable error detection and recovery using a technique of error correction code (ECC). Within the group of memory cells, a subset is to be programmed to the intermediate state. Given the codeword to be stored in the group of memory cells, the number of memory cells in the subset is known. The memory cells in the subset to be programmed to the intermediate state can be programmed together using the voltage pulses as illustrated in FIG. 7. The counter counts the number of memory cells that become conductive under each applied voltage level (e.g., 191, 193, . . . , or 197). When the counted number reaches the known number of memory cells in the subset at the voltage level 197, the magnitude of the subsequent voltage pulse in the time period 185 is determined. For example, after each and every memory cells in the subset become conductive at the voltage level 197, the wordline driver 145 no longer increases its voltage level. Such an approach minimizes the magnitude of the voltage pulse applied in the time period 185 to a level (e.g., at voltage level 197) required to place the entire subset in a conductive state.

In general, different memory cells in the subset can become conductive under different voltage levels (e.g., 191, 193, . . . , 197). When a memory cell 101 becomes conductive (e.g., at voltage level 193) but there is at least one memory cell remaining non-conductive at the level in the subset, the wordline driver 145 connected to the memory cell 101 can limit or keep its voltage level (e.g., at voltage level 193 along line 199 in FIG. 7), while the wordline drivers connected to the remaining non-conductive memory cells further increase their voltage levels (e.g., up to voltage level 197 in FIG. 7). Thus, different wordline drivers for different memory cells in the subset may drive different voltage levels in part of the time period 185.

Alternatively, the subset of memory cells can share the same wordline driver 145. Thus, when the memory cell 101 becomes conductive (e.g., at voltage level 193) but there is at least one memory cell remaining non-conductive at the level in the subset, the wordline driver 145 can further increase its voltage level not only for the remaining non-conductive memory cells in the subset, but also the conductive memory cells in the subset.

FIG. 7 illustrates the control of the magnitude of the subsequent pulse via stepping up the voltage levels 191, 193, . . . 197 driven by the wordline driver 145. Alternatively, or in combination, the bitline driver 147 can be instructed to increment voltage levels in a similar way to control the magnitude of the subsequent pulse.

Optionally, the technique to control/determine the magnitude of the subsequent pulse in the time period 185 can also be applied to the programming pulse in the time period 183.

Similarly, the magnitude of the programming pulse in the time period 183 and/or the magnitude of the subsequent pulse in the time period 185 in FIG. 6 can also be controlled or determined via the counter.

Figure 8:
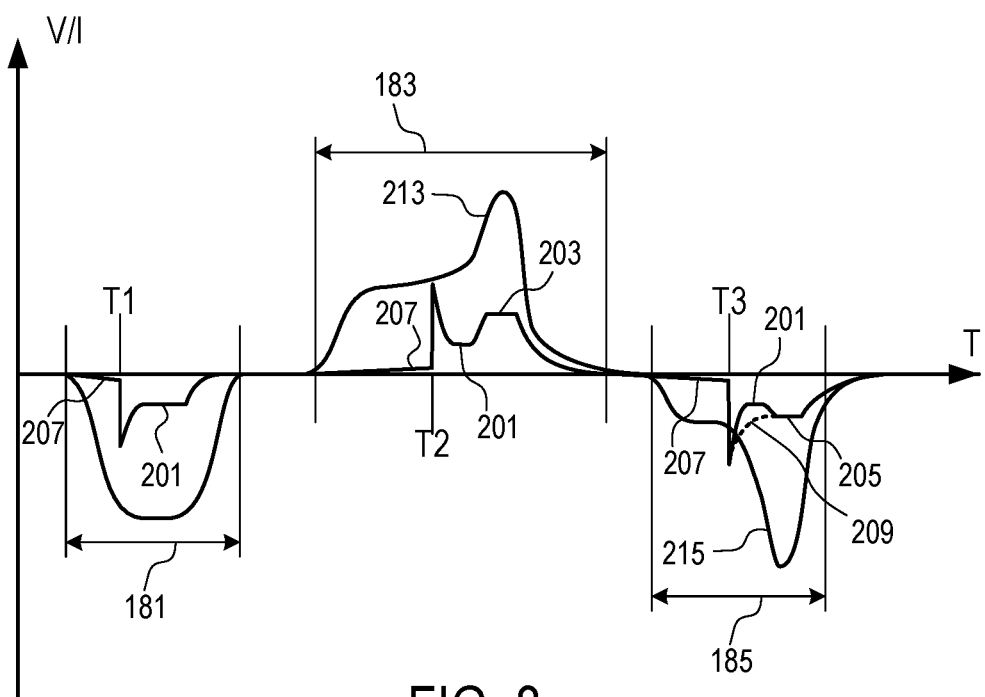
FIG. 8 illustrates voltage applied across a memory cell and current going through the memory cell for the programming of the threshold voltage of the memory cell according to one embodiment.

FIG. 8 illustrates voltage applied across a memory cell and current going through the memory cell for the programming of the threshold voltage of the memory cell according to one embodiment.

For example, the voltage and current profiles as illustrated in FIG. 8 can be generated via the pulses applied according to FIG. 6 or FIG. 7 to a memory cell 101 in a memory device 130 of FIG. 1.

In FIG. 8, a programming voltage pulse in a time period 183 is applied across the memory cell 101 in one polarity (e.g., positive) to move the memory cell 101 to, or close to, a state that is relatively easy to program, such as a state represented by the threshold voltages of the memory cell 101 in the distributions 151 and 152 (or in the distributions 156 and 155) illustrated in FIG. 3.

For example, the threshold voltages of the memory cell 101 can be initially in the distributions 153 and 154 (or in the distributions 156 and 155, or in an unknown and/or random state); and the programming voltage pulse in a time period 183 is used to move the threshold voltages of the memory cell 101 to, or near, the distributions 151 and 153 by placing the memory cell 101 in a conductive state at time T2. When the memory cell 101 snaps from the non-conductive state to the conductive state at time T2, the current going through the memory cell spikes and then returns to a current level 201 that is above a threshold. Before the memory cell 101 snaps at time T2, the programming voltage pulse applied in the time period 183 causes a leak current 207 that is lower than the threshold. After time T2, the programming voltage pulse applied in the time period 183 has a voltage spike 213 that raises the current going through the memory cell 101 to an elevated current level 203 (e.g., 120 µA). When the voltage in the spike 213 drops under the current threshold voltage of the memory cell 101 in the polarity of the applied voltage in the time period 183, the memory cell 101 shuts down and becomes non-conductive; and as a result, the current going through memory cell 101 returns to zero. A termination current is the level of current going passing through the memory cell 101 just before the memory cell 101 shuts down, as the voltage applied across the memory cell 101 going below its threshold voltage. The threshold voltages of the memory cell 101 after the end of the time period 183 are determined primarily by the polarity of the programming voltage pulse applied in the time period 183 and the termination current level 203.

After the time period 183, a subsequent voltage pulse is applied in the time period 185 to further move the threshold voltages of the memory cell 101 to an intermediate state represented by the distributions 153 and 154 in FIG. 4. The subsequent voltage pulse of the time period 185 is applied in the polarity (e.g., negative) opposite to the polarity of the programming pulse of time period 183.

The subsequent voltage pulse in the time period 185 snaps the memory cell 101 at time T3 to cause the memory cell 101 to be conductive. Snapping the memory cell 101 causes a current spike at time T3, which returns quickly to a current level 201 that is above a threshold. Before the snapping at time T3, the leak current 207 going through the memory cell 101 is below the threshold. The subsequent voltage pulse in the time period 185 also has a voltage spike 215, which elevates the current going through the memory cell 101 to an elevated current level 205. The threshold voltages of the memory cell 101 after the time period 185 are primarily determined by the current level 205, the polarity of the subsequent voltage pulse in the time period 185, and the duration of the voltage spike 215. The magnitude of the current level 205 in the subsequent voltage pulse of the time period 185 is smaller than the magnitude of the current level 203 in the programming voltage pulse of the time period 183. In some implementations, the voltage spike 215 is configured to prevent the current going through the memory cell 101 from reducing to the current level 201 and instead to cause the current to drop toward the level 205 along the line 209 in FIG. 8.

The placement of the threshold voltages of the memory cell 101 for the intermediate state in voltage regions in the positive polarity and the negative polarity can be affected by variations in memory cells in the array 133, including variations in the locations of the memory cells in the array and/or their respective electrical distances to their wordline drivers 135 and/or bitline drivers 137. For example, when two memory cells are driven by voltage drivers according to the same voltage configurations, the resulting voltage applied across the memory cells and/or the current going through the memory cells can differ slightly. Such differences in the subsequent voltage pulse applied in the time period 185 can have significant contribution to the variations in the threshold voltages in the two memory cells. Such variations can enlarge the voltage regions of the distributions 153 and 154 of the intermediate state, which can reduce the gaps to distributions 151, 152, 155, and 156. To reduce the variations and thus enlarge the gaps between distributions representative of different states, certain aspects of the subsequent voltage pulse applied in the time period 185 for the programming of the intermediate state can be adjusted based on the classification of the memory cells, based on attributes such as the location, deck, or address of the memory cells, the electrical distances between the memory cells and their voltage drivers, etc. For example, aspects of the subsequent voltage pulse that can be adjusted to reduce variations can include ramp rate, amplitude, duration, etc. For example, ramp rate and/or the duration of the subsequent voltage pulse applied in the time period 185 can be adjusted based on a timing difference between a wordline driver 145 starting to drive a voltage pulse and a bitline driver 147 starting to drive a voltage pulse, and/or a timing difference between a wordline driver 145 stopping to drive a voltage pulse and a bitline driver 147 stopping to drive a voltage pulse. In some instances, a voltage pulse can be skipped, or added to fine tune the threshold voltages of the memory cell, based on its classification, to reduce variations in threshold voltages programmed for the intermediate state among memory cells programmed to the intermediate state. In some instances, the polarities of the pulses in FIG. 8 are all reversed to fine tune the threshold voltages of the memory cell programmed to the intermediate state, based on a classification of the memory cell 101.

In FIG. 8, an optional voltage pulse is configured in the time period 181 to cancel or reduce a possible drift in the thresholds of the memory cell 101. The optional voltage pulse snaps the memory cell 101 at time T1 to cause the memory cell 101 to be conductive. Snapping the memory cell 101 causes a current spike at time T1, which returns quickly to the current level 201 (e.g., 25 µA) that is above a threshold. Before the snapping at time T1, the leak current 207 going through the memory cell 101 is below the threshold. The optional voltage pulse in the time period 181 does not have a voltage spike to elevate the current going through the memory cell 101 to above current level 201. The low current level 201 and/or the short duration of the optional voltage pulse in the time period 181 causes the cancellation or reduction in the drift of the threshold voltages.

The magnitude of the optional voltage pulse (e.g., applied in the negative polarity) can be smaller than the voltage region of the high magnitude distribution (e.g., distribution 152 in the negative polarity) but larger than the voltage regions of the other distributions (e.g., distributions 154 and 156 in the negative polarity). Thus, if the memory cell 101 is already in the voltage distribution to be programmed via the programming pulse of the time period 183 (e.g., distribution 151), the optional voltage pulse does not snap the memory cell 101. Thus, by sensing whether the optional voltage pulse snaps the memory cell 101, the memory device 130 can determine whether the threshold voltages of the memory cell 101 are already in the target voltage regions (e.g., of distributions 151 and 152) of the programming pulse of the time period 183; and if so, the application of the programming pulse of the time period 183 can be skipped.

Figure 9:
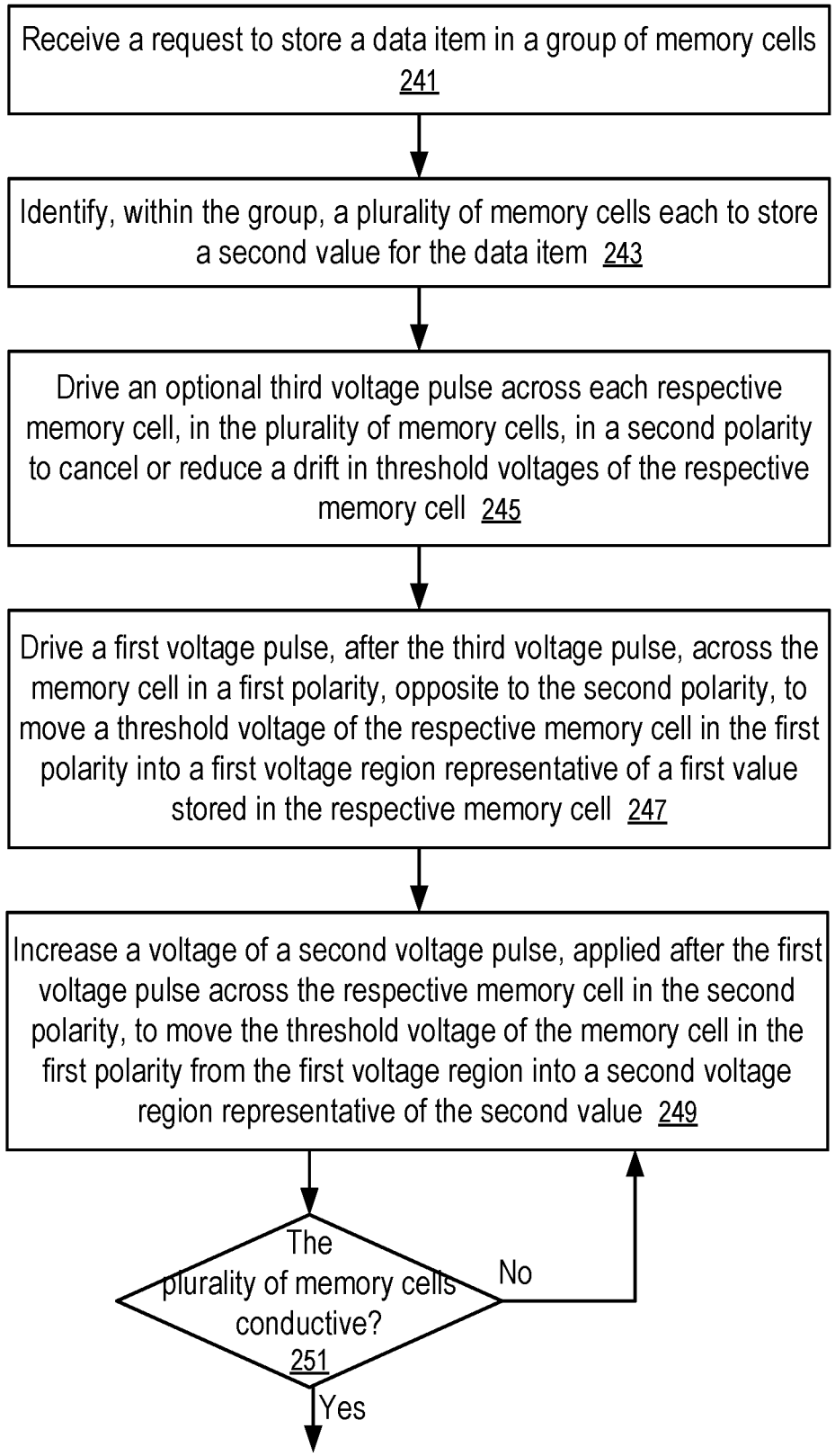
FIG. 9 shows a method to program the threshold voltage of a group of memory cells according to one embodiment.

FIG. 9 shows a method to program the threshold voltage of a group of memory cells according to one embodiment. For example, the method of FIG. 9 can be implemented in a memory device 130 of FIG. 1 having a controller 131 with a programming manager 113, as illustrated in FIGS. 1 and 2, using the threshold programming techniques discussed above in connection with FIGS. 3 to 8.

At block 241, the controller 131 receives a request to store a data item in a group of memory cells. For example, the data item can be a codeword of an Error Correction Code (ECC).

At block 243, the controller 131 identifies, within the group, a plurality of memory cells each to store a second value for the data item. For example, the second value is to be represented by an intermediate state of having threshold voltages between the voltage regions of distributions represented by a first value and a third value.

At block 245, the controller 131 instructs voltage drivers (e.g., bitline drivers 137 and wordline drivers 135) to drive an optional third voltage pulse across each respective memory cell 101, in the plurality of memory cells, in a second polarity to cancel or reduce a drift in threshold voltages of the respective memory cell 101.

For example, the optional third voltage pulse can be applied in the time period 181 illustrated in FIGS. 6 to 8 to cause a termination current of having a third current level 201 (e.g., 25 µA).

At block 247, the controller 131 instructs the voltage drivers to drive a first voltage pulse, after the third voltage pulse, across the memory cell 101 in a first polarity, opposite to the second polarity, to move a threshold voltage of the respective memory cell 101 in the first polarity into a first voltage region representative of a first value stored in the respective memory cell.

For example, the first voltage pulse can be applied in the time period 183 illustrated in FIGS. 6 to 8 to cause a termination current having a first current level 203 (e.g., 120 µA).

At block 249, the controller 131 instructs the voltage drivers to increase a voltage of a second voltage pulse, applied after the first voltage pulse across the respective memory cell 101 in the second polarity, to move the threshold voltage of the memory cell 101 in the first polarity from the first voltage region into a second voltage region representative of the second value.

For example, the second voltage pulse can be applied in the time period 185 illustrated in FIGS. 6 to 8 cause a termination current having a second current level 205 smaller than the first current level 203, but larger than the third current level.

At block 251, the controller 131 determines whether the plurality of memory cells are conductive. If any of the plurality of memory cells remain conductive, the controller 131 instructs the voltage drivers to increase the voltage of the second voltage pulse to the next increment to perform the operation of block 249. Otherwise, no further increment is applied to the second voltage pulse.

For example, each of the third voltage pulse of the time period 181, the first voltage pulse of the time period 183, and the second voltage pulse of the time period 85 can be configured to cause the memory cell 101 to change from non-conductive to conductive once and then change back to non-conductive once. For example, each of the voltage pulse has a voltage increases to above the threshold voltage of the memory cell 101, and then decreases to below the threshold voltage of the memory cell 101, where the threshold voltage of the memory cell 101 can change in between.

For example, the plurality of memory cells can share a bitline driver 147 (or a wordline driver 143) such that the second voltage pulse is applied to the plurality of memory cells in parallel.

For example, the shared bitline driver 147 (or the shared wordline driver 143) can increase the magnitude of the second voltage pulse for the plurality of memory cells to be programmed to the intermediate state to a lowest increment that snaps all of the plurality of memory cells.

For example, the memory device can include a counter configured to count the number of memory cells that have been snapped at the current increment of the voltage of the second voltage pulse. When the value in the counter reaches the total number of the plurality of memory cells, the voltage of the second voltage pulse is not further increased.

Optionally, different memory cells in the plurality of memory cells can be applied with different magnitudes of the second voltage pulse. When an applied magnitude increment of the second voltage pulse snaps the memory cell 101 in the plurality of memory cells, the magnitude of the second voltage pulse applied to the memory cell 101 is not further increased; and the magnitudes applied on remaining non-conductive memory cells to be configured to the intermediate states can be further increased to snap the remaining memory cells.

Optionally, the controller 131 can instruct the voltage drivers to customize some aspects of the second voltage pulse applied to the plurality of memory cells for storing the second memory device, based on the locations, addresses, and/or classifications of the memory cells in the memory device. For example, the aspects can include ramp rate, amplitude, duration, etc. of the second voltage pulse applied in the time period 185; and the customization can be implemented via a timing difference between a bitline driver 147 connected to the memory cell 101 and a wordline driver 145 connected to the memory cell 101, such as a timing difference in starting to drive a voltage and/or stopping to drive the voltage.

Figure 10:
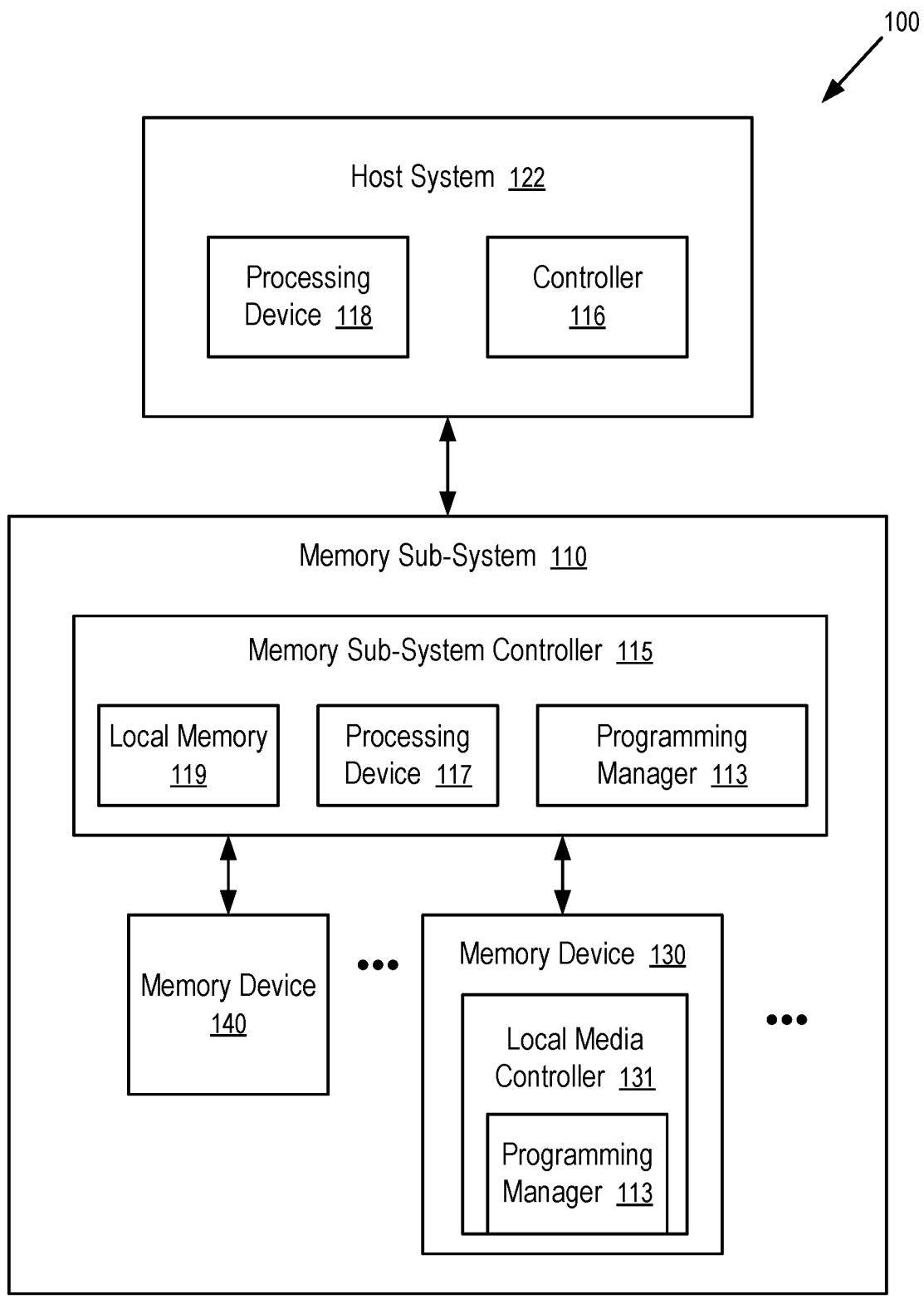
FIG. 10 illustrates an example computing system having a memory sub-system in accordance with some embodiments of the present disclosure.

FIG. 10 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130 of FIG. 1), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 100 can include a host system 122 that is coupled to one or more memory sub-systems 110. FIG. 10 illustrates one example of a host system 122 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 122 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 122 uses the memory sub-system 110, for example, to write data to the memory sub-system 110 and read data from the memory sub-system 110.

The host system 122 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 122 and the memory sub-system 110. The host system 122 can further utilize an NVM Express (NVMe) interface to access components (e.g., memory devices 130 of FIG. 1) when the memory sub-system 110 is coupled with the host system 122 by the PCIe interface. The physical host interface can provide an interface for passing control, address, data, and other signals between the memory sub-system 110 and the host system 122. FIG. 10 illustrates a memory sub-system 110 as an example. In general, the host system 122 can access multiple memory sub-systems via a same communication connection, multiple separate communication connections, and/or a combination of communication connections.

The processing device 118 of the host system 122 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 122 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from the memory sub-system 110 into information for the host system 122.

The controller 116 of the host system 122 can communicate with the controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell.

Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative- or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (e.g., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (e.g., processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 122.

In some embodiments, the local memory 119 can include memory registers storing memory pointers, fetched data, etc. The local memory 119 can also include read-only memory (ROM) for storing micro-code. While the example memory sub-system 110 in FIG. 10 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 122 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 122 via the physical host interface. The host interface circuitry can convert the commands received from the host system into command instructions to access the memory devices 130 as well as convert responses associated with the memory devices 130 into information for the host system 122.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 131 that operate in conjunction with the memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 131) for media management within the same memory device package. An example of a managed memory device is a managed NAND (MNAND) device.

The controller 115 and/or a memory device 130 can include a programming manager 113, such as the programming manager 113 discussed above in connection with FIGS. 1 to 9. In some embodiments, the controller 115 in the memory sub-system 110 includes at least a portion of the programming manager 113. In other embodiments, or in combination, the controller 116 and/or the processing device 118 in the host system 122 includes at least a portion of the programming manager 113. For example, the controller 115, the controller 116, and/or the processing device 118 can include logic circuitry implementing the programming manager 113. For example, the controller 115, or the processing device 118 (e.g., processor) of the host system 122, can be configured to execute instructions stored in memory for performing the operations of the programming manager 113 described herein. In some embodiments, the programming manager 113 is implemented in an integrated circuit chip (e.g., memory device 130) installed in the memory sub-system 110. In other embodiments, the programming manager 113 can be part of firmware of the memory sub-system 110, an operating system of the host system 122, a device driver, or an application, or any combination therein.

Figure 11:
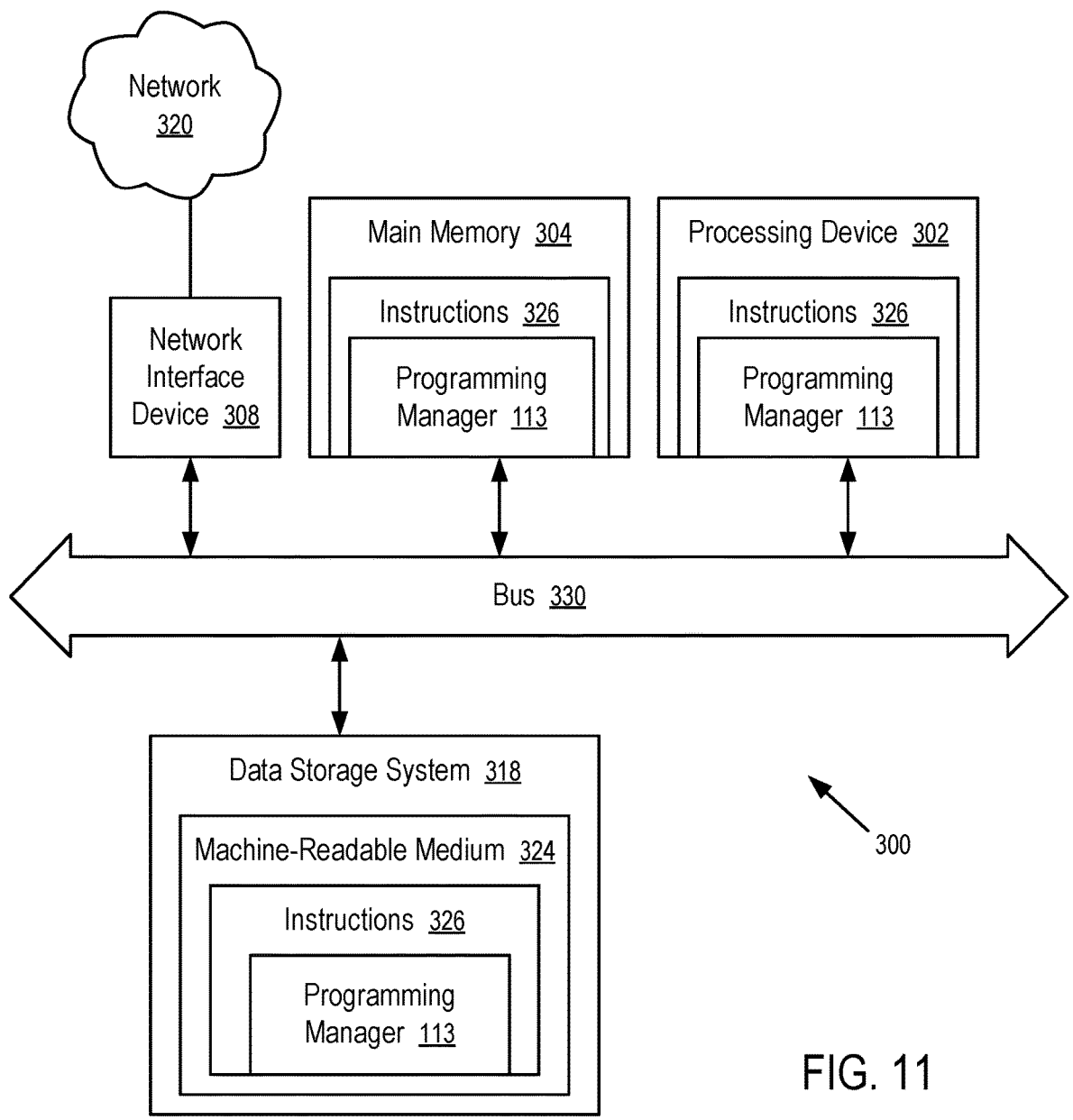
FIG. 11 is a block diagram of an example computer system in which embodiments of the present disclosure can operate.

FIG. 11 illustrates an example machine of a computer system 300 within which a set of instructions, for causing the machine to perform any one or more of the methodologies discussed herein, can be executed. In some embodiments, the computer system 300 can correspond to a host system (e.g., the host system 122 of FIG. 10) that includes, is coupled to, or utilizes a memory sub-system (e.g., the memory sub-system 110 of FIG. 10) or can be used to perform the operations of a programming manager 113 (e.g., to execute instructions to perform operations corresponding to the programming manager 113 described with reference to FIGS. 1-15). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 300 includes a processing device 302, a main memory 304 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 318, which communicate with each other via a bus 330 (which can include multiple buses).

Processing device 302 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 302 can also be one or more special-purpose processing devices such as an application specific integrated circuit (ASIC), a field programmable gate array (FPGA), a digital signal processor (DSP), network processor, or the like. The processing device 302 is configured to execute instructions 326 for performing the operations and steps discussed herein. The computer system 300 can further include a network interface device 308 to communicate over the network 320.

The data storage system 318 can include a machine-readable medium 324 (also known as a computer-readable medium) on which is stored one or more sets of instructions 326 or software embodying any one or more of the methodologies or functions described herein. The instructions 326 can also reside, completely or at least partially, within the main memory 304 and/or within the processing device 302 during execution thereof by the computer system 300, the main memory 304 and the processing device 302 also constituting machine-readable storage media. The machine-readable medium 324, data storage system 318, and/or main memory 304 can correspond to the memory sub-system 110 of FIG. 10.

In one embodiment, the instructions 326 include instructions to implement functionality corresponding to a programming manager 113 (e.g., the programming manager 113 described with reference to FIGS. 1-10). While the machine-readable medium 324 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:
   memory cells;
   voltage drivers connected to the memory cells; and
   a controller coupled to the voltage drivers;
   wherein the controller is configured to instruct the voltage drivers to:
      drive a first voltage pulse across a memory cell in a first polarity to cause a first level of current to go through the memory cell and to move a threshold voltage of the memory cell in the first polarity into a first voltage region representative of a first value stored in the memory cell; and
      drive a second voltage pulse, after the first voltage pulse, across the memory cell in a second polarity, opposite to the first polarity, to cause a second level of current to go through the memory cell and to move the threshold voltage of the memory cell in the first polarity from the first voltage region into a second voltage region representative of a second value stored in the memory cell;
   wherein a magnitude of the second voltage pulse is determined by the voltage drivers increasing a voltage of the second voltage pulse in increments until a plurality of memory cells, including the memory cell, become conductive;
   wherein each of the first voltage pulse and the second voltage pulse is configured to cause the memory cell to change from non-conductive to conductive once and then change back to non-conductive once; and
   wherein when the memory cell is non-conductive, the memory cell allows a current less than a threshold to go through the memory cell; and the first level of current and the second level of current have magnitudes larger than the threshold.

2. The device of claim 1, wherein the memory cell is programmed to have the threshold voltage in the first polarity in the second voltage region representative of the second value in response to a command to store a codeword in a group of memory cells, including the plurality of memory cells to store the second value for the codeword; and the controller is configured to instruct the voltage drivers to apply the second voltage pulse to the plurality of memory cells in parallel.

3. The device of claim 2, wherein the plurality of memory cells are programmed in parallel to store the second value; and the device further comprises a counter configured to count a number of memory cells that become conductive at an increment of the voltage of the second voltage pulse.

4. The device of claim 3, wherein in response to a determination that the memory cell is conductive at the increment but a value in the counter is less than a total number of memory cells in the plurality of memory cells, the voltage drivers are further instructed to increase to a next increment of the voltage of the second voltage pulse.

5. The device of claim 3, wherein in response to a determination that the memory cell is conductive at the increment but a value in the counter is less than a total number of memory cells in the plurality of memory cells, the voltage drivers are further instructed to increase to a next increment of the voltage of the second voltage pulse applied to non-conductive memory cells in the plurality of memory cells but not to increase the voltage of the second voltage pulse applied to the memory cell.

6. The device of claim 3, wherein the controller is further configured to instruct the voltage drivers to drive a third voltage pulse, prior to the first voltage pulse, across the memory cell in the second polarity, opposite to the first polarity, to cause a third level of current, larger than the threshold, to go through the memory cell.

7. The device of claim 6, wherein the third level of current is smaller than the first level of current and the second level of current; and the third voltage pulse causes the memory cell to change from non-conductive to conductive once and then change back to non-conductive once.

8. The device of claim 7, wherein the plurality of memory cells share a voltage driver configured to apply the voltage of the second voltage pulse in increments according to a value of the counter during the second voltage pulse.

9. The device of claim 7, wherein the controller is further configured to customize an aspect of the second voltage pulse based on a location of the memory cell in the device.

10. The device of claim 9, wherein the second voltage pulse is applied on the memory cell via two voltage drivers each connected to one side of the memory cell; and the aspect of the second voltage pulse is customized via a timing difference in starting or stopping driving by the two voltage drivers.

11. A method, comprising:
   receiving a request to store a second value in a memory cell;
   driving a third voltage pulse across the memory cell in a second polarity to cancel or reduce a drift in threshold voltages of the memory cell;
   driving a first voltage pulse, after the third voltage pulse, across the memory cell in a first polarity, opposite to the second polarity, to move a threshold voltage of the memory cell in the first polarity into a first voltage region representative of a first value stored in the memory cell; and
   driving a second voltage pulse, after the first voltage pulse, across the memory cell in the second polarity, opposite to the first polarity, to move the threshold voltage of the memory cell in the first polarity from the first voltage region into a second voltage region representative of the second value stored in the memory cell.

12. The method of claim 11, wherein each of the second voltage pulse and the third voltage pulse is configured to increase to above a threshold voltage of the memory cell in the second polarity once and then reduce to below the threshold voltage of the memory cell in the second polarity once; and the first voltage pulse is configured to increase to above the threshold voltage of the memory cell in the first polarity once and then reduce to below the threshold voltage of the memory cell in the first polarity once.

13. The method of claim 12, further comprising:
sensing that the third voltage pulse exceeds the threshold voltage of the memory cell in the second polarity, wherein the driving of the first voltage pulse is responsive to the third voltage pulse exceeds the threshold voltage of the memory cell in the second polarity, and the first voltage pulse is skipped when the third voltage pulse does not exceed the threshold voltage of the memory cell in the second polarity once.

14. The method of claim 13, wherein a termination current of the third voltage pulse applied to the memory cell is smaller than both a termination current of the first voltage pulse applied to the memory cell and a termination current of the second voltage pulse applied to the memory cell; and the termination current of the first voltage pulse is larger than the termination current of the second voltage pulse.

15. The method of claim 14, wherein the third voltage pulse not exceeding the threshold voltage of the memory cell in the second polarity once is indicative of the memory cell is storing the first value.

16. An integrated circuit, comprising:
a layer of bitlines;
a layer of wordlines;
memory cells configured between the layer of the bitlines and the layer of the wordlines, each of the memory cells connected to a bitline among the bitlines and to a wordline among the wordlines;
bitline drivers connected to the bitlines;
wordline drivers connected to the wordlines; and
a controller coupled to the bitline drivers and the wordline drivers and configured to, in response to a request to store a codeword in first memory cells, among the memory cells,
identify a plurality of memory cells within the first memory cells, each of the plurality of memory cells to store a second value for the codeword;
drive a first voltage pulse across each of the plurality of memory cells in a first polarity to move a threshold voltage of each respective memory cell of the plurality of memory cells in the first polarity into a first voltage region representative of a first value stored in the respective memory cell; and
ramp up a voltage of a second voltage pulse, applied after the first voltage pulse across the respective memory cell in a second polarity, opposite to the first polarity, to move the threshold voltage of the memory cell in the first polarity from the first voltage region into a second voltage region representative of the second value stored in the respective memory cell, until the voltage of the second voltage pulse is determined to have exceeded threshold voltages of the plurality of memory cells in the second polarity for the respective memory cell.

17. The integrated circuit of claim 16, wherein in response to a determination that, at an increment of the voltage of the second voltage pulse, a first subset of the plurality of memory cells are conductive and a second subset of the plurality of memory cells are non-conductive, the controller is configured to instruct the bitline drivers and the wordline drivers to further ramp up the voltage of the second voltage pulse to a next increment for both the first subset and the second subset.

18. The integrated circuit of claim 16, wherein in response to a determination that, at an increment of the voltage of the second voltage pulse, a first subset of the plurality of memory cells are conductive and a second subset of the plurality of memory cells are non-conductive, the controller is configured to instruct the bitline drivers and the wordline drivers to further ramp up the voltage of the second voltage pulse to a next increment for the second subset but not for the first subset.

\* \* \* \* \*